United States Patent
Kim et al.

(10) Patent No.: US 8,040,179 B2
(45) Date of Patent: Oct. 18, 2011

(54) APPARATUS AND METHOD FOR ESTIMATING POWER FOR AMPLIFIER

(75) Inventors: Jung-ho Kim, Yongin-si (KR); Young-tae Kim, Seongnam-si (KR); Sang-chul Ko, Seoul (KR); Jung-woo Choi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 42 days.

(21) Appl. No.: 12/623,383

(22) Filed: Nov. 21, 2009

(65) Prior Publication Data

US 2010/0156529 A1    Jun. 24, 2010

(30) Foreign Application Priority Data

Dec. 23, 2008   (KR) .................... 10-2008-0132501

(51) Int. Cl.
*G01R 19/00*   (2006.01)
(52) U.S. Cl. .......................... 330/2; 330/149
(58) Field of Classification Search ............. 330/2, 149
See application file for complete search history.

(56) References Cited

U.S. PATENT DOCUMENTS

| | | | | |
|---|---|---|---|---|
| 5,959,500 A | * | 9/1999 | Garrido | 330/151 |
| 6,044,106 A | * | 3/2000 | Suzuki | 375/219 |
| 6,931,292 B1 | * | 8/2005 | Brumitt et al. | 700/94 |
| 7,013,011 B1 | | 3/2006 | Weeks et al. | |
| 7,362,818 B1 | * | 4/2008 | Smith et al. | 375/296 |
| 7,366,252 B2 | * | 4/2008 | Cova et al. | 375/296 |
| 7,414,470 B2 | | 8/2008 | Okazaki | |
| 7,515,714 B2 | * | 4/2009 | Orihashi et al. | 380/255 |
| 7,587,316 B2 | * | 9/2009 | Morii | 704/226 |
| 2004/0136545 A1 | | 7/2004 | Sarpeshkar et al. | |

FOREIGN PATENT DOCUMENTS

JP    2007-19782    1/2007
JP    2007-243549    9/2007

* cited by examiner

*Primary Examiner* — Patricia Nguyen
(74) *Attorney, Agent, or Firm* — NSIP Law

(57) ABSTRACT

Described herein is an apparatus and method for estimating the amount of power that is to be consumed by an amplifier. An estimation section may be determined based on frame data of an input signal that is to be input to the amplifier. The estimation section may be stored to in a predetermined section, and the amount of power to be consumed by the amplifier may be estimated in advance based on the stored signal. The predetermined section may be determined in consideration of response a characteristic of a power supply of the amplifier. The amount of power may be calculated by assigning weight to the stored signal.

16 Claims, 6 Drawing Sheets

APPARATUS AND METHOD FOR ESTIMATING POWER FOR AMPLIFIER

CROSS-REFERENCE TO RELATED APPLICATION

This application claims the benefit under 35 U.S.C. §119 (a) of a Korean Patent Application No. 10-2008-0132501, filed Dec. 23, 2008, the entire disclosure of which is incorporated herein by reference in its entirety for all purposes.

BACKGROUND

1. Field

The following description relates to signal processing technology and amplification processing technology, and more particularly, to technology for controlling an output distortion that may arise due to a change in supply voltage.

2. Description of the Related Art

A digital amplifier functions to modulate and amplify input signals. In an output terminal of a digital amplifier, active elements such as transistors may be formed in a bridge structure. In operating the digital amplifier, it may be desirable to have constant external power supplied to the output terminal.

If a supply voltage to be applied to the output terminal is cut off intermittently or fluctuates, an output signal of the digital amplifier may be distorted. In the case of a digital amplifier which processes audio signals, such fluctuations in supply voltage may cause the sound-quality deterioration.

In attempt to address the above, two approaches have been considered.

A first approach is to adopt a power supply with a sufficient capacity. However, this method is believed to face limitations in terms of manufacturing costs. The expense of constantly maintaining enough voltage can be expensive, and unnecessary. The other approach is to compensate for supply voltage fluctuations by controlling changes in characteristics caused by the supply voltage fluctuations. A representative example is a feedback control scheme that controls the differences between output signals and ideal signals. However, since such a feedback control scheme uses error signals generated in the previous step, there are difficulties in real-time control. Furthermore, there is no solution for supply voltage fluctuations that occur in transitional periods such as at the start and the end of a control operation.

SUMMARY

In one general aspect, there is provided an apparatus to estimate an amount of power that is to be consumed by an amplifier, the apparatus including a sub buffer to store frame data of an input signal that is to be input to the amplifier, a section setter to determine a size of the sub buffer in consideration of a response characteristic of a power supply that drives the amplifier, a weight assigner to assign weight to the frame data stored in the sub buffer to generate weighted frame data, and a power estimator to estimate the amount of power that is to be consumed by the amplifier based on the weighted frame data.

The section setter may determine the size of the sub buffer in consideration of a time constant of the power supply.

The weight assigner may assign a higher weight to data that is to be processed first among the frame data stored in the sub buffer, and assign a lower weight to data that is to be processed after the data that is to be processed first.

The weight assigner may assign the weight to the frame data stored in the sub buffer using a weight function that has an independent variable that corresponds to each cell area of the sub buffer.

The weight function may be a linear function to which characteristics of the input signal are reflected. The weight function may be a nonlinear function to which characteristics of the input signal are reflected.

The sub buffer may raise data stored in each cell area of the sub buffer to the second power and stores the second power value of the data therein.

The power estimator may estimate the amount of power that is to be consumed by the amplifier based on an average of the frame data to which weight has been assigned.

The apparatus may further include a converter to convert the input signal into the frame data.

The amplifier may be a digital amplifier.

In another general aspect, there is provided a method of estimating an amount of power that is to be consumed by an amplifier, the method comprising storing frame data of an input signal that is to be input to the amplifier in an estimation section, assigning weight to the frame data stored in the estimation section to generate weighted frame data, and estimating the amount of power based on the weighted frame data.

The method may further comprise determining the estimation section in consideration of a response characteristic of a power supply which drives the amplifier.

Data that is to be processed first among the frame data stored in the estimation section may be assigned a higher weight, and data that is to be after the data to be processed first may be assigned a lower weight.

The weight may be assigned using a weight function that has an independent variable that corresponds to each cell area of the estimation section.

The weight function may be a linear function to which characteristics of the input signal are reflected. The weight function may be a nonlinear function to which characteristics of the input signal are reflected.

The amplifier may be a digital amplifier.

Other features and aspects will be apparent from the following detailed description, the drawings, and the claims.

BRIEF DESCRIPTION OF THE DRAWINGS

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Various changes, modifications, and equivalents of the systems, apparatuses, and/or methods described herein will be suggested to those of ordinary skill in the art. Also, descriptions of well-known functions and constructions may be omitted for increased clarity and conciseness.

Figure 1:
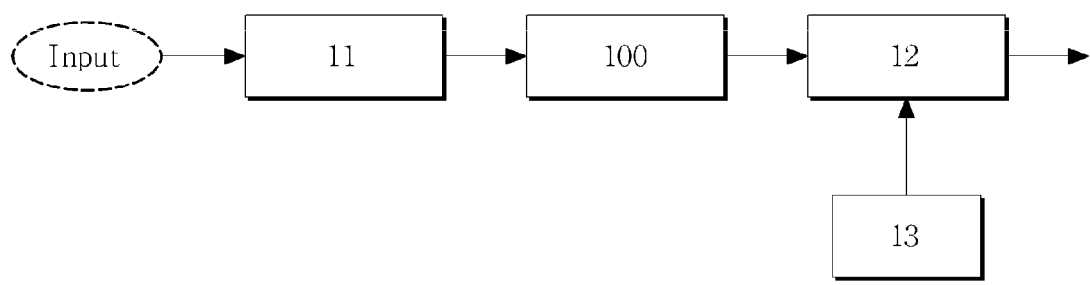
FIG. 1 is a block diagram illustrating an exemplary signal processing apparatus including a power estimator.

FIG. 1 illustrates an exemplary signal processing apparatus including a power estimator 100. The signal processing apparatus may further include an input buffer 11, an amplifier 12, and a power supply 13.

As an illustration, the signal processing apparatus may be a sound processor to amplify a sound signal, an audio signal processing apparatus, a digital signal processing apparatus, a radio signal processing apparatus, and the like.

An exemplary operation of the signal processing apparatus is described below.

An input signal is applied to the amplifier 12 via the input buffer 11. The amplifier 12 amplifies the received signal. The power supply 13 supplies a driving voltage to the amplifier 12 for amplification of the signal. The quality of signals output from the amplifier 12 may be directly affected by the power supply 13. If an unexpected change occurs in the voltage supplied from the power supply 13, the output signal of the amplifier 12 may be distorted.

The power estimator 100 may estimate in advance an amount of power that will be desired for amplification of an input signal. If the amount of power is estimated, it is possible to compensate for an input signal in advance based on the estimated amount of power so as to prevent output distortions.

The power estimator 100 may estimate the amount of power that will be desired using a predetermined estimation section and one or more predetermined weights.

The amplifier 12 may be a digital amplifier, and the input buffer 11 may be provided to receive and process a digital signal.

Figure 2:
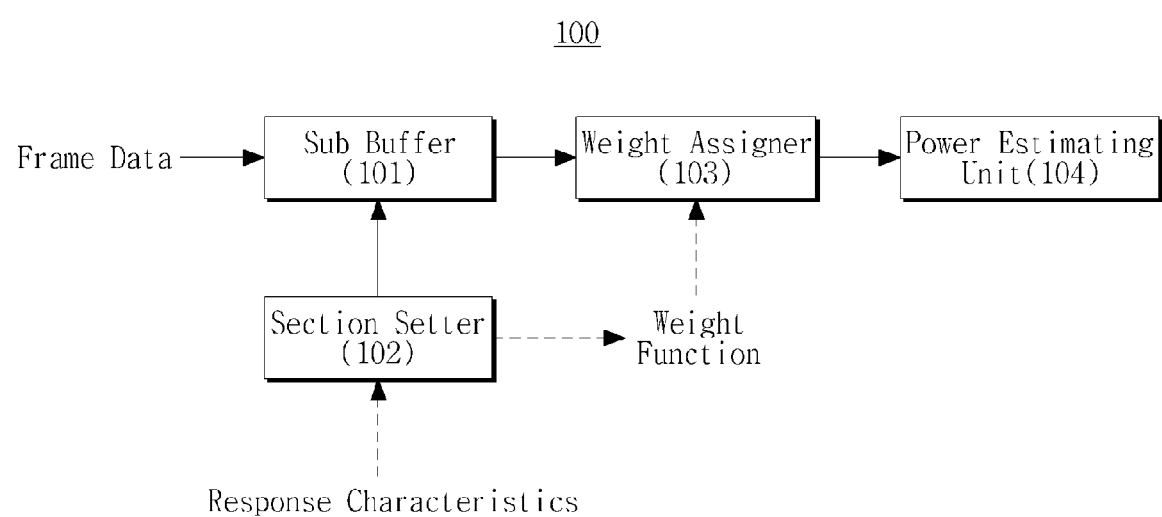
FIG. 2 is a block diagram illustrating an example of the power estimator.

FIG. 2 illustrates an example of the power estimator 100.

Referring to FIG. 2, the power estimator 100 includes a sub buffer 101, a section setter 102, a weight assigner 103, and a power estimating unit 104.

Referring to FIGS. 1 and 2, the sub buffer 101 temporarily stores frame data of an input signal that is to be input to and processed by the amplifier 12. For example, if the input signal is input in units of frames, the frame data may be temporarily stored in the input buffer 11 and the sub buffer 101 may extract all or some of the frames and the data stored therein, and temporarily store the extracted data in the sub buffer 101.

The section setter 102 determines an estimation section. The estimation section may correspond to the amount of an input signal that is to be stored in advance in order to estimate the amount of required power. The estimation section may be based on frame data of an input signal that is to be input to the amplifier 12. The estimation section may correspond to a size of the sub buffer 101. In other words, the section setter 102 may determine the size of the sub buffer 101. In some embodiments, the estimation section and the sub buffer 101 may be of different sizes.

The size of the sub buffer 101 determined by the section setter 102 may be based on response characteristics of the power supply 13. The response characteristics of the power supply 13 may be a time constant of the power supply 13. For example, by modeling the characteristics of the power supply 13, information about the response characteristics of the power supply 13 may be obtained and the time constant of the power supply 13 may be calculated using the information about the response characteristics. A time constant may be an index indicating how fast a certain system responds to a change in input. In some embodiments, the estimation section may be determined based on the time constant of the power supply 13.

The weight assigner 103 may assign weights to the data stored in the sub buffer 101 to form weighted frame data. For example, the weight assigner 103 may assign a different weight to each piece of the data stored in the sub buffer 101. In one example, the weight assigner 103 assigns the weights using a predetermined weight function. The weight function may be a linear or nonlinear function to which the characteristics of input signals are reflected. The weight function may be defined using an independent variable which corresponds to the estimation section.

For example, the weight assigner 103 may assign a relatively high weight to data that is to be processed first among the data stored in the sub buffer 101. The weight assigner 103 may assign a lower weight to data that is to be processed after the data that is to be processed first.

In some embodiments, the weight may be assigned linearly based upon the order in which the data is to be processed. For example, the first unit of data to be processed may be assigned a weight of W=x. The second unit of data to be processed may be assigned a weight of W=x−1. The third unit of data to be processed may be assigned a weight of W=x−2. This series may continue until the last unit of data to be processed is assigned a weight. The series may continue until a predetermined number of data units have been assigned a weight. This is just one example of a weighting method, and other desired methods may be used.

The power estimating unit 104 estimates the amount of power for data that is to be output from the output terminal of the amplifier 12, based on the weighted frame data. For example, the sub buffer 101 may raise each data value stored in the input buffer 11 to the second power and outputs the squared value of the data to the weight assigner 103. The power estimating unit 104 may estimate the amount of power to be consumed by the amplifier using an average of the data values to which weights have been assigned.

By determining an estimation section in consideration of the response characteristics of the power supply 13, storing an input signal that is to be processed in the estimation section, and calculating the amount of power for the stored input signal using a weight function, the input signal may be preprocessed so as to prevent the output distortions.

Figure 3:
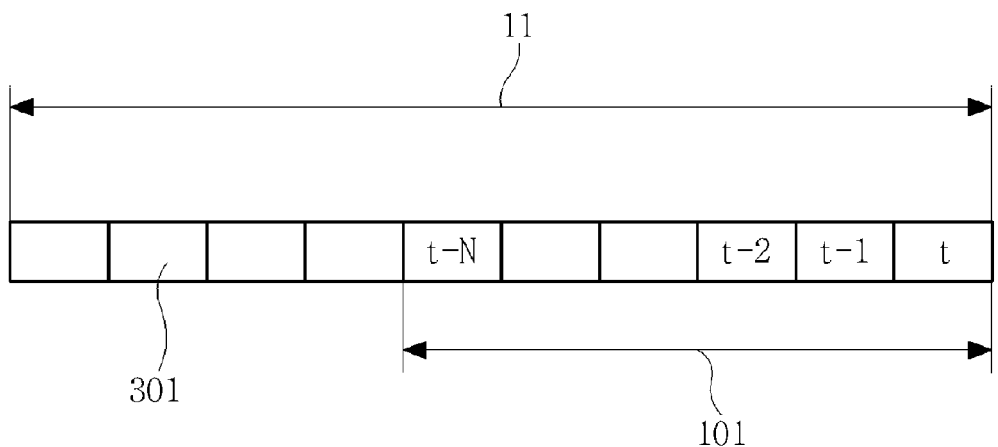
FIG. 3 is a diagram illustrating an example of a sub buffer included in the power estimator.

FIG. 3 illustrates an example of the sub buffer 101.

Referring to FIGS. 1 and 3, the input buffer 11 may comprise a plurality of cells, for example, ten cells 301. The number of cells in the input buffer 11 is not limited to ten, and may comprise other number of cells. The sub buffer 101 may comprise a plurality of cells, for example, six cells 301. The number of cells in the sub buffer 101 is not limited to six, and may comprise other number of cells. The cells 301 may store frame data in predetermined units.

For example, if ten pieces of data are in the cells stored in the input buffer 11, the sub buffer 101 may extract N pieces of data, for example, six pieces of data from among the ten pieces of data. After extraction, the sub buffer 101 may raise each data value to the second power and store the squares of the data therein.

Also, since data stored in the input buffer 11 or sub buffer 101 is frame data, data from t to t-N may be sequentially input to and processed by the amplifier 12. The size of the sub buffer 101, for example, the N value, may be determined by the section setter 102 described above.

Figure 4:
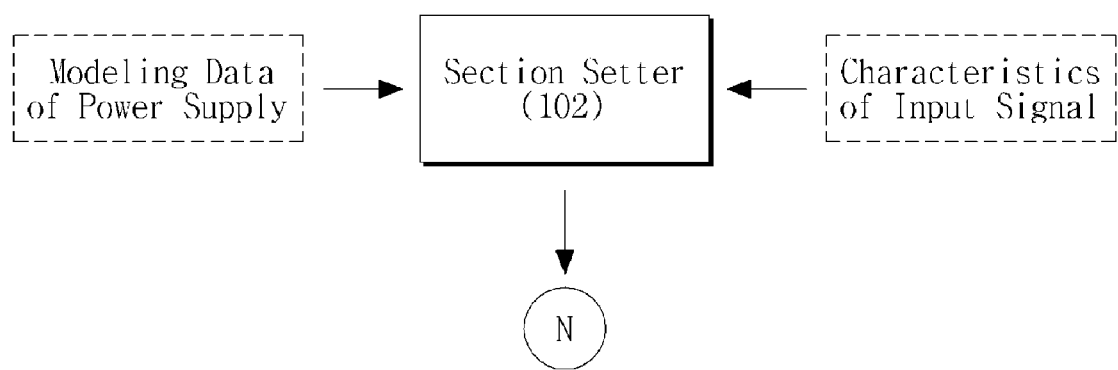
FIG. 4 is a diagram for illustrating an exemplary operation of a section setter included in the power estimator.

FIG. 4 is a diagram for illustrating an exemplary operation of the section setter 102.

Referring to FIGS. 1 to 4, the section setter 102 determines the size of the sub buffer 101, for example, the N value in FIG. 3. The determination is based on modeling data of the power supply 13 and/or the characteristics of input signals.

The modeling data of the power supply 13 may be information about the response characteristics of the power supply 13. The information about the response characteristics may comprise a time constant of the power supply that is an index indicating how fast a system responds to a change in input. The section setter 102 may determine the N value based on a time constant of the power supply 13.

The relationship between the time constant and the N value may be set to be in proportion or comparative relation to each other. In some embodiments, the N value may be determined based on the characteristics of input signals and the time constant. For example, for a power supply that is sensitive to a change in input, the N value may be set to be a smaller value.

Figure 9:
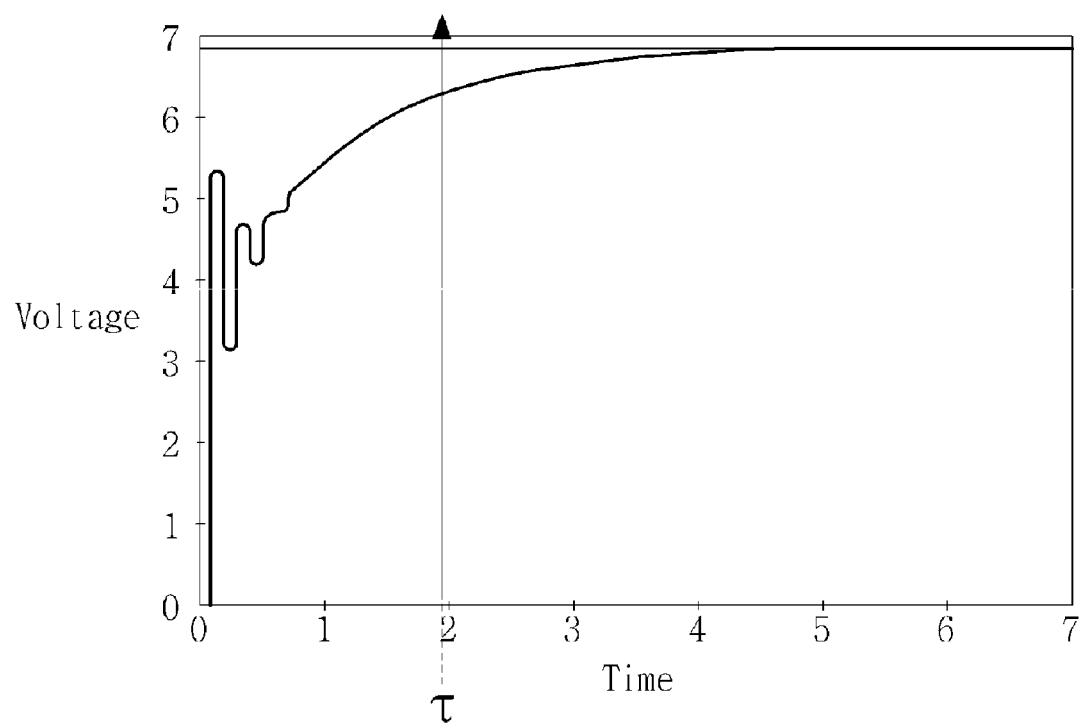
FIG. 9 is a graph illustrating exemplary response characteristics of a power supply.

The time constant of the power supply 13 can be calculated by applying a step input to the power supply 13 and measuring a time at which a response reaches a predetermined level of the steady-state response. For example, the time at which a response reaches a level in a range of from about 25% to 100%, from about 50% to 95%, from about 60% to 90%, or other desired level of the steady-state response. FIG. 9 illustrates a graph of the time constant in terms of voltage over time. As shown in FIG. 9, the time constant can be calculated by applying the step input to the power supply 13 and measuring the time at which the response reaches a predetermined level, for example, from about 63% to about 90% of the steady-state response.

Figure 5:
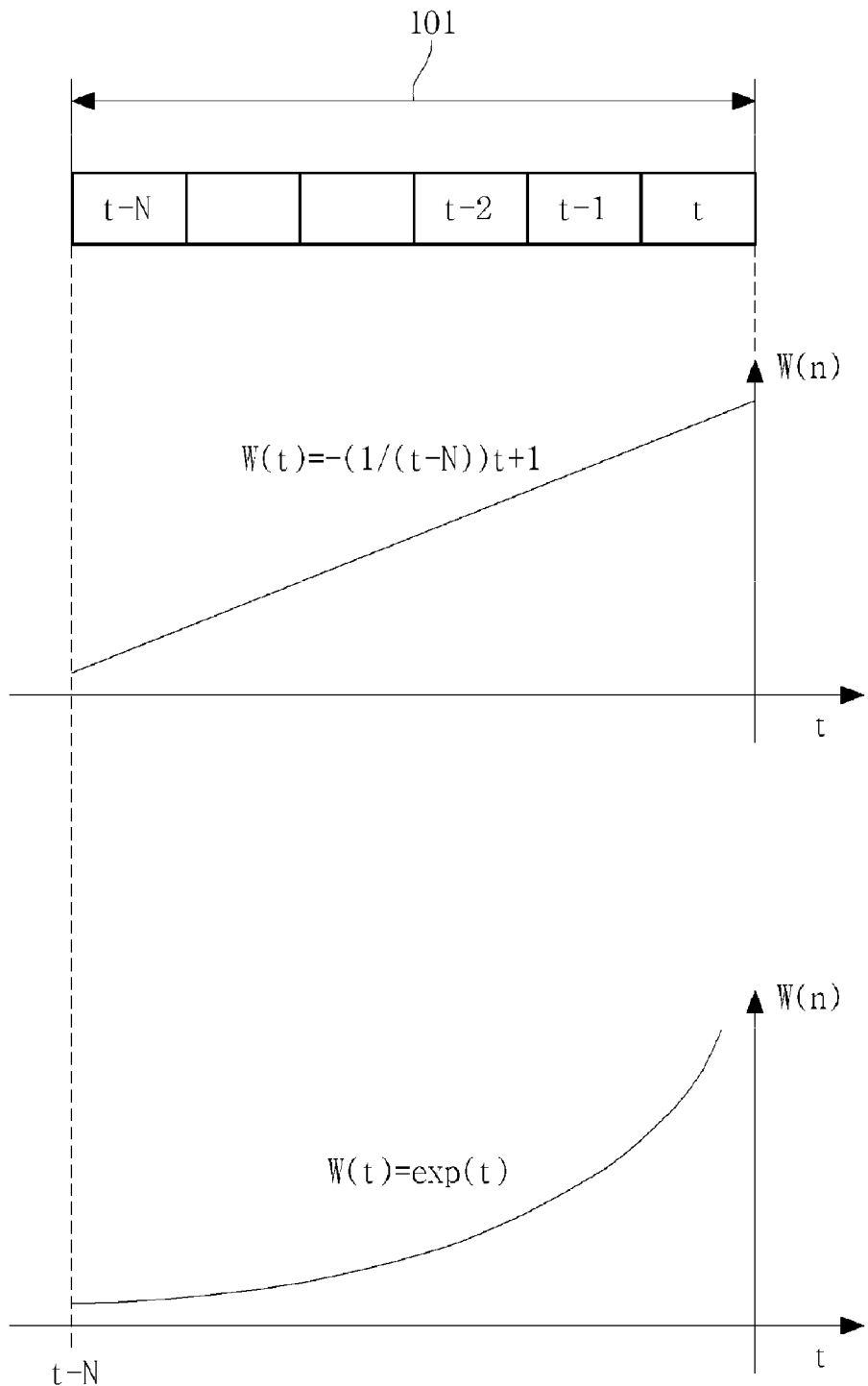
FIG. 5 is a diagram for explaining a weight function according to an exemplary embodiment.

FIG. 5 is a diagram for illustrating a weight function W(t) according to an exemplary embodiment.

Referring to FIGS. 3 and 5, the weight function W(t) may be defined using an independent variable which corresponds to the cell areas 301 of the sub buffer 101. As shown in FIG. 5, N may correspond to the size of the sub buffer 101 or the size of the estimation section determined by the section setter 102, as described above.

The weight function W(t) may have various functional forms. In this example, when W(t)=1, this corresponds to the case where a current time t and a future time t-N have an equivalent weight. Assigning an equivalent weight does not reflect variability of the current time t, and makes estimation of dynamic changes difficult. To help illustrated variability, and as illustrated in FIG. 5, the weight function W(t) may be given as a linear function or exponential reduction function.

For example, relatively high weights may be assigned to data that is to be processed first. Relatively lower weights may be assigned to data that is to be processed later. An estimation of the dynamic changes may be performed on the weighted frame data.

Figure 6:
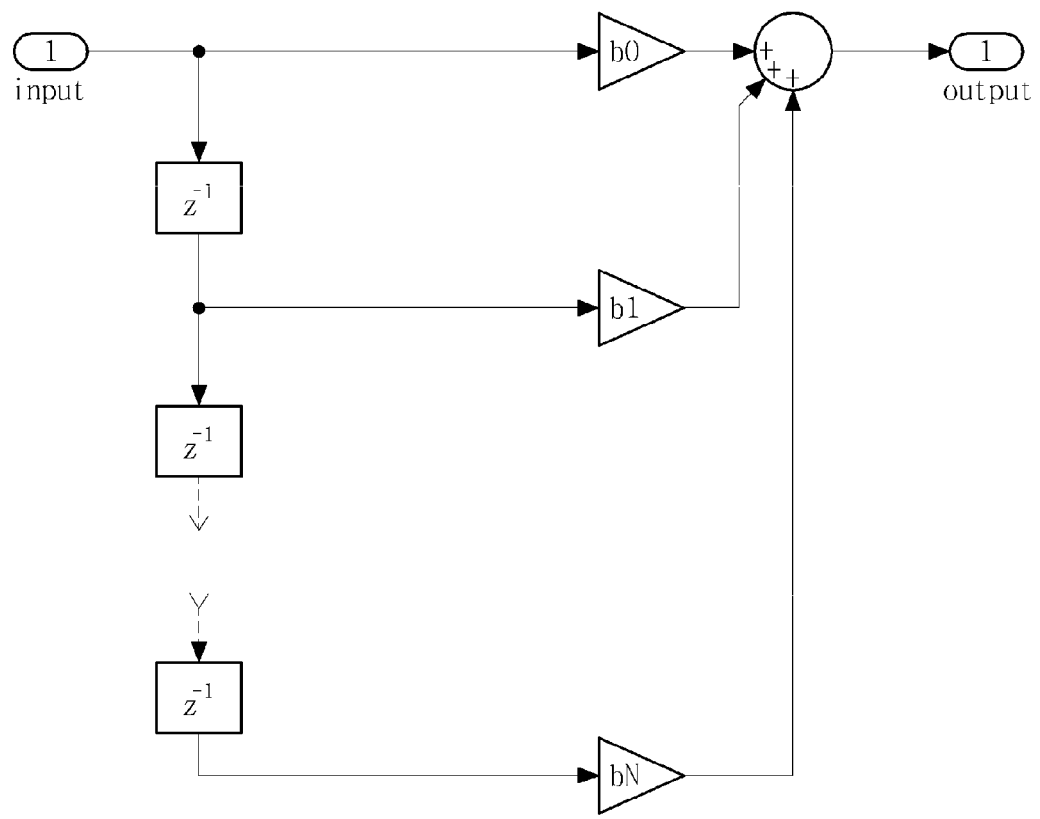
FIG. 6 is a circuit diagram illustrating an exemplary weight assigner included in the power estimator.

FIG. 6 is a circuit diagram illustrating the weight assigner 103 according to an exemplary embodiment.

Referring to FIGS. 2 and 6, the weight assigner 103 may be implemented using one or more discrete finite impulse response (FIR) filters. The weight assigner 103 may multiply the respective pieces of data stored in the sub buffer 101 by coefficients $b_0, b_1, \ldots, b_n$ of a weight function, respectively, at predetermined time delays $z^{-1}$. The time delay $z^{-1}$ may be implemented while assigning weights to the stored data.

In some embodiments, the weight assigner 103 may be implemented with one or more infinite impulse response (IIR) filters.

Figure 7:
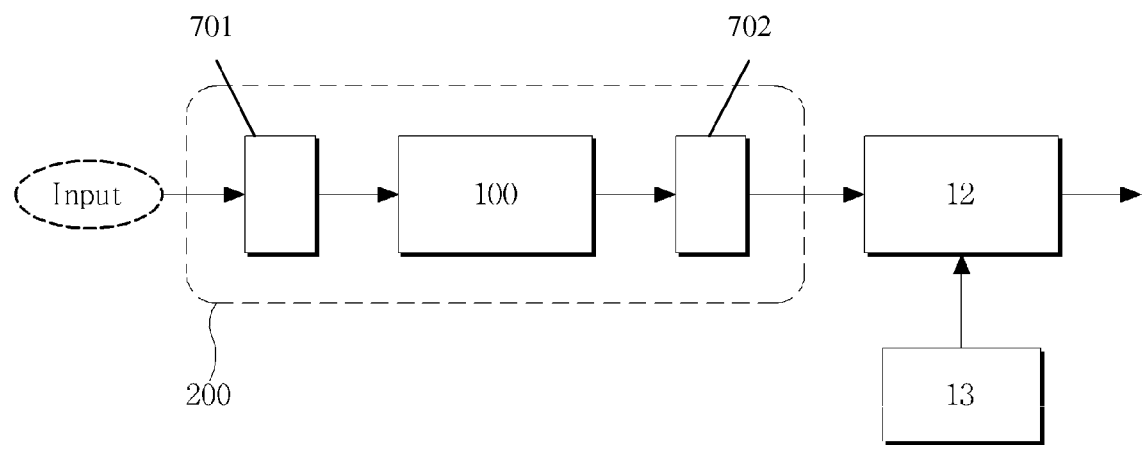
FIG. 7 is a diagram illustrating another exemplary signal processing apparatus including a power estimator.

FIG. 7 illustrates another exemplary signal processing apparatus including a power estimator 200 that includes a converter 701 and an unbuffer processor 702. The signal processing apparatus of FIG. 7 is capable of receiving and processing an analog signal.

In addition to the power estimator 100 illustrated in FIG. 1, the power estimator 200 may further include the converter 701 and the unbuffer processor 702. The converter 701 converts an analog input signal into a digital signal and then converts it into frame data. The frame data is input to and processed by the power estimating unit 100, and the resultant data processed by the power estimating unit 100 is converted into non-frame data by the unbuffer processor 702.

Figure 8:
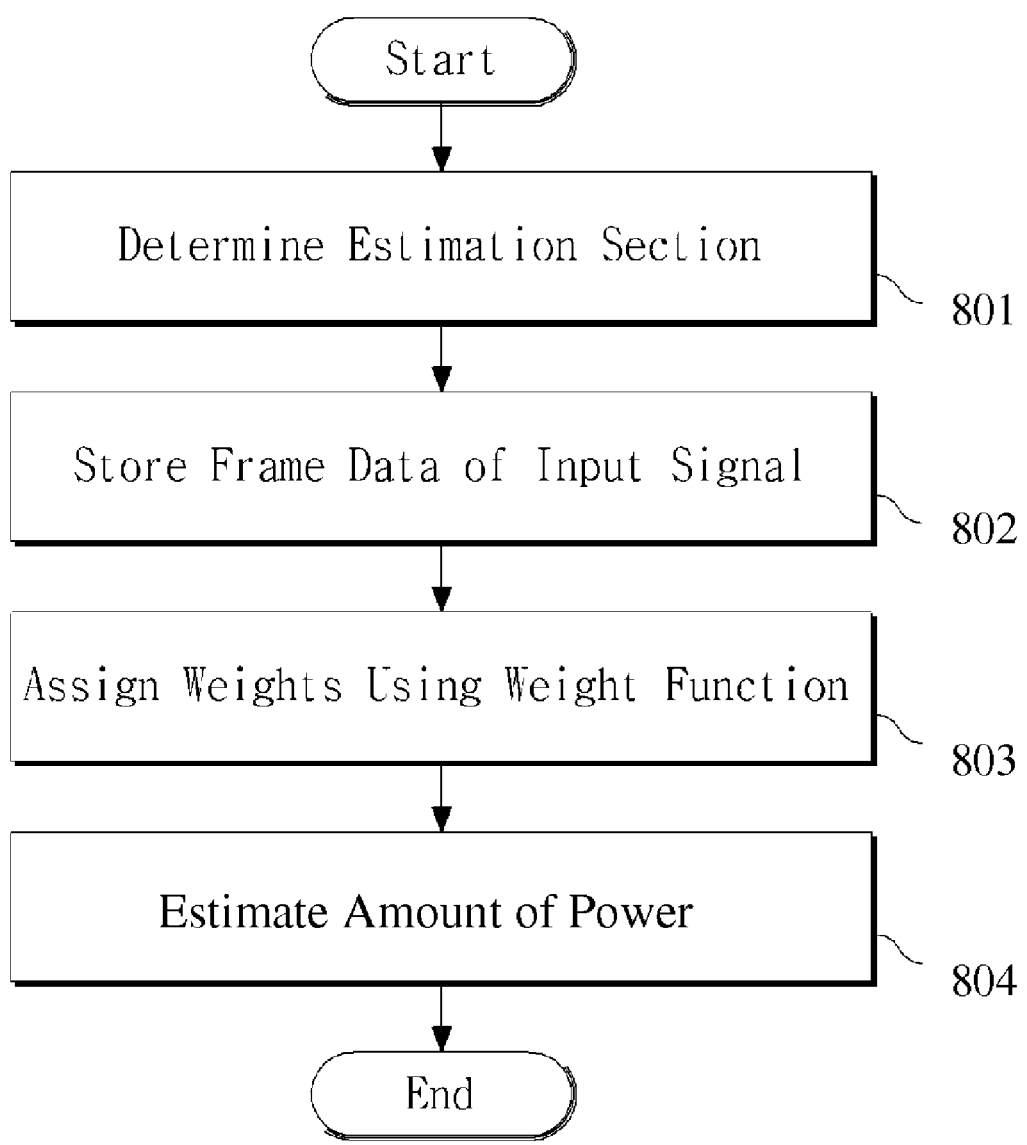
FIG. 8 is a flowchart illustrating an exemplary power estimation method.

FIG. 8 is a flowchart illustrating an exemplary power estimation method. The power estimation method may be used to control output distortions of an amplifier of a signal processing apparatus, for example, the signal processing apparatus that includes the power estimator 100 or 200 described above.

For estimating the amount of power to be consumed by an amplifier, an estimation section is determined 801. The estimation section may be determined based on the response characteristics, for example, a time constant of a power supply. As illustrated in FIG. 4, the section setter 102 may determine a value for N based on modeling data of a power supply and/or characteristics of input signals, and determine the size of the sub buffer 101. The section setter 102 may determine an independent variable part of a weight function using the N value.

Frame data of an input signal that is to be input to the amplifier is stored to correspond to the estimation section 802. For example, as illustrated in FIG. 3, all or some of cell data stored in the input buffer 11 may be extracted, and the extracted data may be raised to the second power, or squared, and then stored temporarily in the sub buffer 101. The size of the sub buffer 101 may correspond to the estimation section. In some embodiments, the extracted data may be raised by other desired methods, for example, the extracted data may be raised to a third power, a fourth power, or subjected to an algorithm.

Weights are assigned successively to the data stored in correspondence to the estimation section 803. The weights may not be a fixed value and may be assigned using a weight function. For example, as illustrated in FIG. 5, by assigning relatively high weights to data that is to be first processed and assigning relatively lower weights to data that is to be later processed, estimation of dynamic changes may be made possible.

The amount of needed power may be estimated based on the data to which weights have been assigned 804. For example, the amount of power desired may be calculated using an average of the data to which the weights have been assigned.

A power estimation method may further include determining whether a finally estimated amount of power appropriately reflects the characteristics of the system, and varying the estimation section and/or weight function according to the result of the determination.

According to example(s) described above, changes in power and output distortions caused by changes in power supply may be controlled by estimating in advance, the amount of power used or desired at a specific time in future. By assigning different weights according to time, it may be possible to provide a more efficient response to a dynamic change.

The methods described above may be recorded, stored, or fixed in one or more computer-readable storage media that includes program instructions to be implemented by a computer to cause a processor to execute or perform the program instructions. The media may also include, alone or in combination with the program instructions, data files, data structures, and the like. Examples of computer-readable media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The described hardware devices may be configured to act as one or more software modules in order to perform the operations and methods described above, or vice versa. In addition, a computer-readable storage medium may be distributed among computer systems connected through a network and computer-readable codes or program instructions may be stored and executed in a decentralized manner.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An apparatus to estimate an amount of power that is to be consumed by an amplifier, the apparatus comprising:
   a sub buffer to store frame data of an input signal that is to be input to the amplifier;
   a section setter to determine a size of the sub buffer in consideration of a response characteristic of a power supply that drives the amplifier;
   a weight assigner to assign weight to the frame data stored in the sub buffer to generate weighted frame data; and
   a power estimator to estimate the amount of power that is to be consumed by the amplifier based on the weighted frame data.

2. The apparatus of claim 1, wherein the section setter determines the size of the sub buffer in consideration of a time constant of the power supply.

3. The apparatus of claim 1, wherein the weight assigner assigns a higher weight to data that is to be processed first among the frame data stored in the sub buffer, and assigns a lower weight to data that is to be processed after the data that is to be processed first.

4. The apparatus of claim 1, wherein the weight assigner assigns the weight to the frame data stored in the sub buffer using a weight function that has an independent variable that corresponds to each cell area of the sub buffer.

5. The apparatus of claim 4, wherein the weight function is a linear function to which characteristics of the input signal are reflected.

6. The apparatus of claim 4, wherein the weight function is a nonlinear function to which characteristics of the input signal are reflected.

7. The apparatus of claim 1, wherein the sub buffer raises data stored in each cell area of the sub buffer to the second power and stores the second power value of the data therein.

8. The apparatus of claim 1, wherein the power estimator estimates the amount of power that is to be consumed by the amplifier based on an average of the frame data to which weight has been assigned.

9. The apparatus of claim 1, further comprising a converter to convert the input signal into the frame data.

10. The apparatus of claim 1, wherein the amplifier is a digital amplifier.

11. A method of estimating an amount of power that is to be consumed by an amplifier, the method comprising:
    determining an estimation section in consideration of a response characteristic of a power supply which drives the amplifier;
    storing frame data of an input signal that is to be input to the amplifier in the estimation section;
    assigning weight to the frame data stored in the estimation section to generate weighted frame data; and
    estimating the amount of power that is to be consumed by the amplifier based on the weighted frame data.

12. The method of claim 11, wherein data that is to be processed first among the frame data stored in the estimation section is assigned a higher weight, and data that is to be processed after the data to be processed first is assigned a lower weight.

13. The method of claim 11, wherein the weight is assigned using a weight function that has an independent variable that corresponds to each cell area of the estimation section.

14. The method of claim 13, wherein the weight function is a linear function to which characteristics of the input signal are reflected.

15. The method of claim 13, wherein the weight function is a nonlinear function to which characteristics of the input signal are reflected.

16. The method of claim 11, wherein the amplifier is a digital amplifier.

* * * * *